US011338665B1

(12) United States Patent
Casci et al.

(10) Patent No.: US 11,338,665 B1
(45) Date of Patent: May 24, 2022

(54) ELECTRIFIED VEHICLE THERMAL MANAGEMENT SYSTEM AND THERMAL MANAGEMENT METHOD

(71) Applicant: Ford Global Technologies, LLC, Dearborn, MI (US)

(72) Inventors: John Casci, Westland, MI (US); Moon Young Lee, Livonia, MI (US); Fan Wang, Novi, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/213,397

(22) Filed: Mar. 26, 2021

(51) Int. Cl.
*B60K 11/02* (2006.01)
*H02K 9/19* (2006.01)
*B60L 53/302* (2019.01)
*H05K 7/20* (2006.01)

(52) U.S. Cl.
CPC ............ *B60K 11/02* (2013.01); *B60L 53/302* (2019.02); *H02K 9/19* (2013.01); *H05K 7/2089* (2013.01)

(58) Field of Classification Search
CPC ........ B60K 11/02; B60L 58/26; B60L 53/302; H05K 7/20854; H05K 7/2089; H02K 9/17
See application file for complete search history.

(56) References Cited

U.S. PATENT DOCUMENTS

| 9,030,063 B2 | 5/2015 | Rawlinson et al. |
| 2010/0218916 A1 | 9/2010 | Miller et al. |
| 2020/0171935 A1* | 6/2020 | Oki .......................... B60L 58/26 |
| 2021/0301768 A1* | 9/2021 | Hikitani .............. F02B 29/0443 |

FOREIGN PATENT DOCUMENTS

EP  3459775  3/2019

* cited by examiner

*Primary Examiner* — Jacob M Amick
(74) *Attorney, Agent, or Firm* — David B. Kelley; Carlson, Gaskey & Olds, P.C.

(57) ABSTRACT

An electrified vehicle thermal management system includes, among other things, a transmission, an inverter, and a terminal block disposed between the transmission and the inverter. The terminal block includes a conduit configured to deliver transmission fluid from the transmission to the inverter. An electrified vehicle thermal management method includes circulating a transmission fluid between a transmission, a terminal block, and an inverter, and using the transmission fluid to manage thermal energy within the inverter.

19 Claims, 4 Drawing Sheets

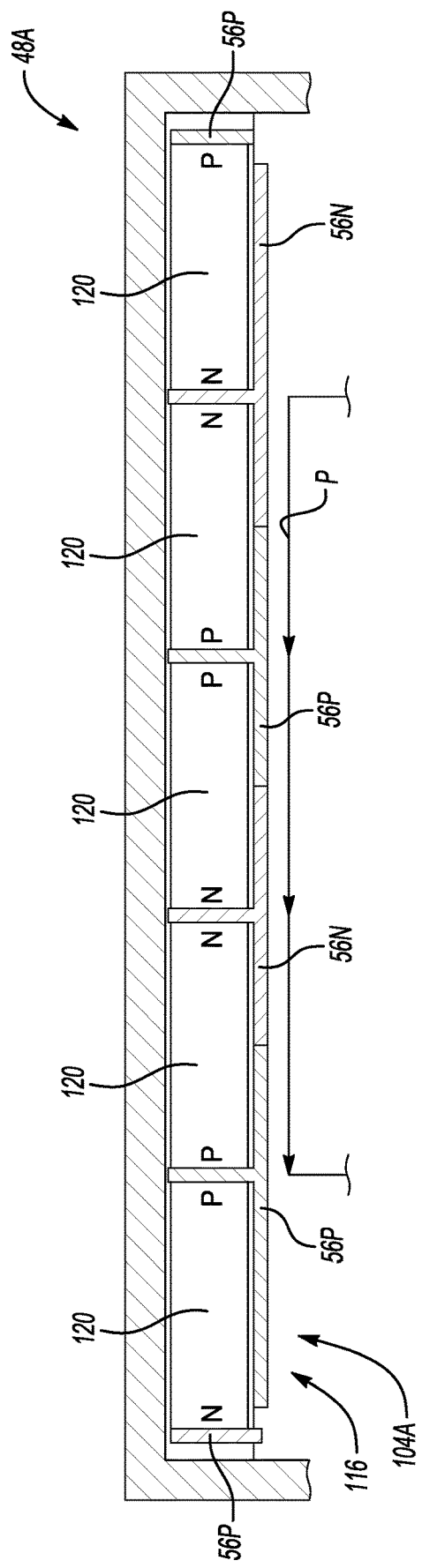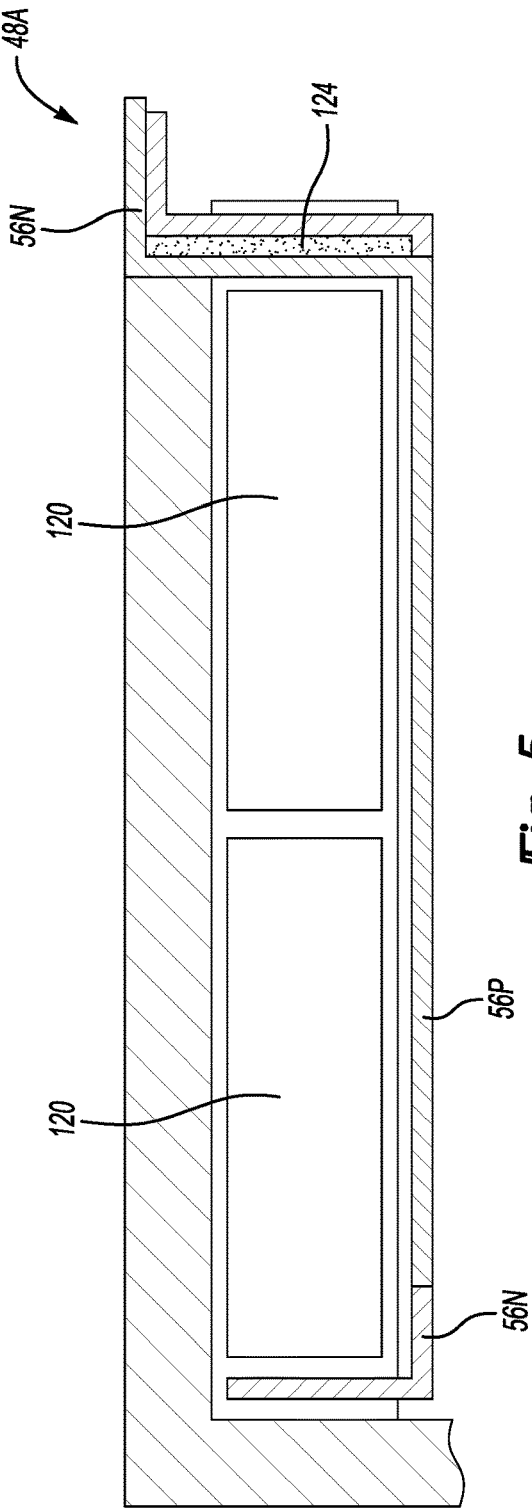

ELECTRIFIED VEHICLE THERMAL MANAGEMENT SYSTEM AND THERMAL MANAGEMENT METHOD

TECHNICAL FIELD

This disclosure relates generally to managing thermal energy in areas of an electrified vehicle and, more particularly, to using transmission fluid to manage thermal energy in an inverter.

BACKGROUND

Electrified vehicles differ from conventional motor vehicles because electrified vehicles are selectively driven using one or more electric machines powered by a traction battery pack. The electric machines can drive the electrified vehicles instead of, or in addition to, an internal combustion engine. Example electrified vehicles include hybrid electric vehicles (HEVs), plug-in hybrid electric vehicles (PHEVs), and battery electric vehicles (BEVs).

SUMMARY

An electrified vehicle thermal management system according to an exemplary aspect of the present disclosure includes, among other things, a transmission, an inverter, and a terminal block disposed between the transmission and the inverter. The terminal block includes a conduit configured to deliver transmission fluid from the transmission to the inverter.

In another example of the foregoing system, the conduit is a first conduit. The terminal block includes a second conduit configured to deliver transmission fluid from the inverter to the transmission.

Another example of any of the foregoing systems includes a plurality of terminal block busbars of the terminal block. The second conduit is configured to communicate transmission fluid that is received from the inverter adjacent to the plurality of terminal block busbars to manage thermal energy within the plurality of terminal block busbars.

Another example of any of the foregoing systems includes a plurality of inverter busbars of the inverter. The first conduit is configured to deliver transmission fluid to the inverter. The transmission fluid manages thermal energy levels within the plurality of inverter busbars.

In another example of any of the foregoing systems, the plurality of terminal block busbars that electrically couple the inverter to a motor within the transmission.

Another example of any of the foregoing systems includes a pump configured to circulate transmission fluid from the transmission through a first conduit in the terminal block to the inverter, and from the inverter through a second conduit in the terminal block to the transmission.

In another example of any of the foregoing systems, the pump draws the transmission fluid from a sump within the transmission.

In another example of any of the foregoing systems, the pump communicates the transmission fluid from the sump to a radiator that is configured to transfer thermal energy from the transmission fluid to air.

In another example of any of the foregoing systems, the pump communicates the transmission fluid from the radiator through a conduit in terminal block and then to the inverter.

Another example of any of the foregoing systems includes plurality of busbars of the inverter. The plurality of busbars are each configured such that the busbars include a portion disposed at an interface between the terminal block and the inverter.

In another example of any of the foregoing systems, the inverter is an inverter system controller of an electrified vehicle.

Another example of any of the foregoing systems includes a radiator that is configured to transfer thermal energy from the transmission fluid to air.

Another example of any of the foregoing systems includes a plurality of busbars within the inverter and outside the transmission. The busbars cooled by transmission fluid that is circulated outside the transmission.

In another example of any of the foregoing systems, the transmission is a transmission of an electrified vehicle.

In another example of any of the foregoing systems, the terminal block is secured directly to the transmission. The inverter is secured directly to the terminal block.

An electrified vehicle thermal management method according to another exemplary aspect of the present disclosure includes circulating a transmission fluid between a transmission, a terminal block, and an inverter, and using the transmission fluid to manage thermal energy within the inverter.

Another example of the foregoing method includes communicating the transmission fluid from the transmission through a conduit in a terminal block and then to the inverter.

Another example of any of foregoing methods includes using the transmission fluid to manage thermal energy within busbars of the inverter.

Another example of any of foregoing methods includes circulating the transmission fluid from the inverter through another conduit in the terminal block and then back to the transmission.

Another example of any of foregoing methods includes using the transmission fluid to manage thermal energy within busbars of the terminal block.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows:

FIG. 4 shows a side view of the inverter system controller according to another exemplary embodiment of the present disclosure.

FIG. 5 shows an end view of the inverter system controller of FIG. 4.

DETAILED DESCRIPTION

This disclosure details a system and method that uses transmission fluid to manage thermal energy within an inverter of an electrified vehicle. The transmission fluid can move to and from the inverter through conduits within a high-voltage alternating current (HVAC) terminal block, which can be sandwiched between an inverter and a transmission block of the electrified vehicle.

Figure 1:
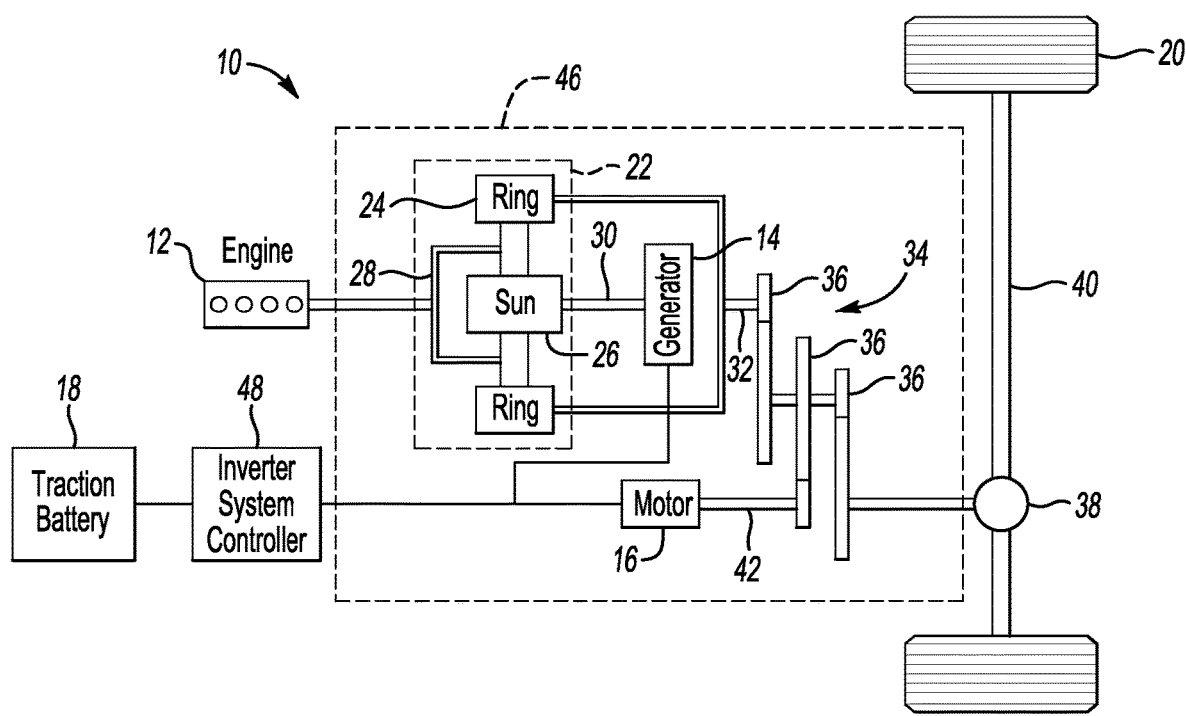
FIG. 1 illustrates a schematic view of a powertrain for an electrified vehicle.

FIG. 1 schematically illustrates selected portions of a powertrain 10 of an electrified vehicle. Although depicted as a hybrid electrified vehicle (HEV), it should be understood that the concepts described herein are not limited to HEVs and could extend to other electrified vehicles, including, but not limited to, plug-in hybrid electrified vehicles (PHEVs), fuel cell vehicles (FCVs), and battery electrified vehicles (BEVs).

In an embodiment, the powertrain 10 is a powersplit powertrain system that employs a first drive system and a second drive system. The first drive system includes a combination of an engine 12 and a generator 14 (i.e., a first electric machine). The second drive system includes at least a motor 16 (i.e., a second electric machine), the generator 14, and at least one traction battery pack 18. In this example, the second drive system is considered an electric drive system of the powertrain 10. The first and second drive systems generate torque to drive one or more sets of vehicle drive wheels 20 of the electrified vehicle. Although a powersplit configuration is depicted in FIG. 1, the teachings of this disclosure extend to any hybrid or electric vehicle including full hybrids, parallel hybrids, series hybrids, mild hybrids or micro hybrids.

The engine 12, which is an internal combustion engine in this example, and the generator 14 may be connected through a power transfer unit 22. In one non-limiting embodiment, the power transfer unit 22 is a planetary gear set that includes a ring gear 24, a sun gear 26, and a carrier assembly 28. Of course, other types of power transfer units, including other gear sets and transmissions, may be used to connect the engine 12 to the generator 14.

The generator 14 can be driven by engine 12 through the power transfer unit 22 to convert kinetic energy to electrical energy. The generator 14 can alternatively function as a motor to convert electrical energy into kinetic energy, thereby outputting torque to a shaft 30 connected to the power transfer unit 22. Because the generator 14 is operatively connected to the engine 12, the speed of the engine 12 can be controlled by the generator 14.

The ring gear 24 of the power transfer unit 22 may be connected to a shaft 32, which is connected to vehicle drive wheels 20 through a second power transfer unit 34. The second power transfer unit 34 may include a gear set having a plurality of gears 36. Other power transfer units may also be suitable. The gears 36 transfer torque from the engine 12 to a differential 38 to ultimately provide traction to the vehicle drive wheels 20. The differential 38 may include a plurality of gears that enable the transfer of torque to the vehicle drive wheels 20. In this example, the second power transfer unit 34 is mechanically coupled to an axle 40 through the differential 38 to distribute torque to the vehicle drive wheels 20.

The motor 16 (i.e., the second electric machine) can also be employed to drive the vehicle drive wheels 20 by outputting torque to a shaft 42 that is also connected to the second power transfer unit 34. In one embodiment, the motor 16 and the generator 14 cooperate as part of a regenerative braking system in which both the motor 16 and the generator 14 can be employed as generators to output electrical energy. For example, the motor 16 and the generator 14 can each output electrical power to the traction battery pack 18.

A transmission 46 of the exemplary powertrain 10 includes the power transfer unit 22, the gears 36, the motor 16, and the generator 14. The transmission 46 can transmit power from the engine 12 to the differential 38.

The traction battery pack 18 has the form of a high-voltage battery that is capable of outputting electrical power to operate the motor 16 and the generator 14 within the transmission 46. The traction battery pack 18 is a traction battery as it provides power to drive the vehicle drive wheels 20.

The powertrain 10 may additionally include an inverter system, which may also be referred to as an inverter system controller (ISC) 48. The ISC 48 is adapted to support bidirectional power flow through the powertrain 10. For example, the ISC 48 can convert DC power derived from the traction battery pack 18 to AC power for driving the motor 16, the generator 14, or both. The ISC 48 can be combined with a variable voltage converter (ISC/VVC). In the exemplary embodiment, the ISC 48 is outside the transmission 46. In other examples, portions of the ISC 48, such as an inductor of the ISC 48 can be at least partially disposed within a housing of the transmission 46.

Transmission fluid can manage thermal energy within the transmission 46. Exemplary electrified vehicle thermal management systems and methods of this disclosure utilize transmission fluid to additionally manage thermal energy in other areas of the powertrain 10 that are not part of the transmission, such as thermal energy within the ISC 48.

Managing thermal energy, for purposes of this disclosure can include removing thermal energy to lower a temperature of a component, adding thermal energy to raise a temperature of a component, or maintaining a temperature of a component.

Figure 2:
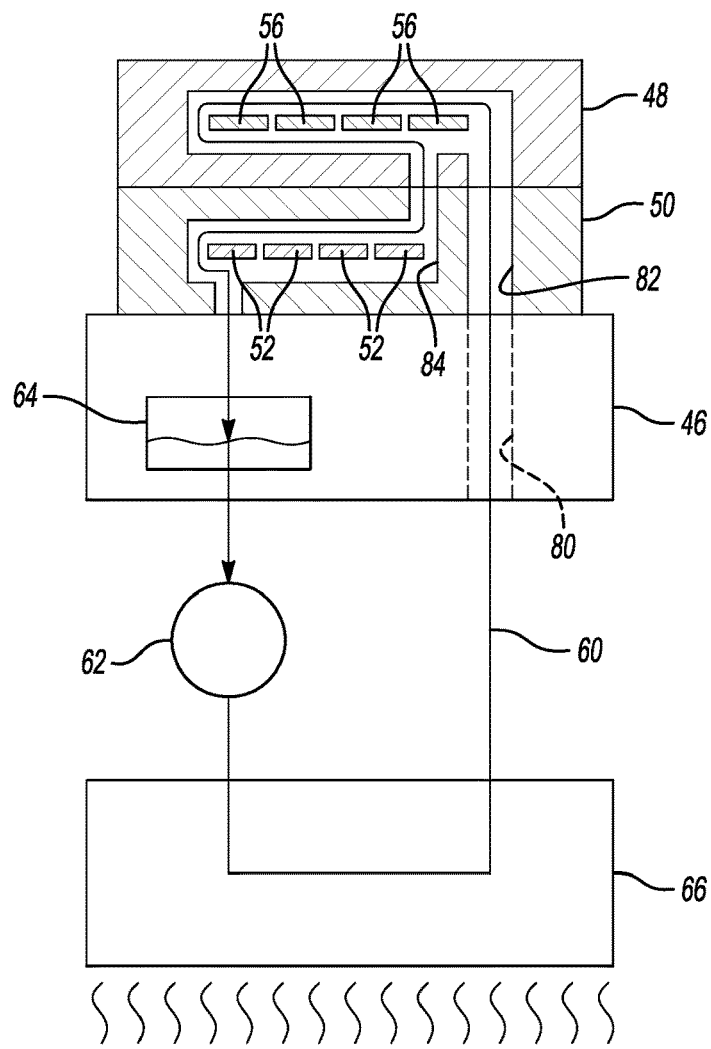
FIG. 2 illustrates a highly schematic view of a thermal management system used in connection with the powertrain of FIG. 1 according to an exemplary embodiment of the present disclosure.

With reference to FIG. 2, a terminal block 50 is adjacent the transmission 46 and the ISC 48. In particular, the ISC 48 is secured directly to the terminal block 50, which is secured directly to the transmission 46. The ISC 48 can be secured to the terminal block 50 using mechanical fasteners, for example. The terminal block 50 can be secured to the transmission 46 using mechanical fasteners, for example. In the exemplary embodiment, the terminal block 50 is a High Voltage Alternating Current (HVAC) terminal block.

The terminal block 50 can electrically couple the motor 16 to the ISC 48 in order to output AC power for driving the motor 16. For example, the ISC 48 may receive DC power from the traction battery pack 18 (FIG. 1), and may convert this DC power to three-phase AC power. The AC power is carried to the motor 16 by the terminal block 50 for driving the motor 16.

The terminal block 50 includes a plurality of busbars 52 for electrically coupling the ISC 48 and the motor 16. The busbars 52 can be operatively coupled to current sensors. Reducing thermal energy within the busbars 52 can help to avoid raising a temperature of the current sensors to an undesirable level. The current sensors can envelope portions of the busbars 52. Cooling the busbars 52 can cool the associated current sensors.

In this example, the terminal block 50 includes four busbars 52. However, the total number of busbars 52 is not intended to limit this disclosure. That is, a greater or fewer number of busbars 52 than are shown in the FIG. 2 could be employed within the terminal block 50.

In a non-limiting embodiment, the busbars 52 are made of copper. However, other materials may also be suitable. The busbars 52 can electrically connect motor stator leads, which can be connected to windings of the motor 16, to current sensors.

Through the busbars 52, the terminal block 50 electrically couples at least the motor 16 within the transmission 46 to the ISC 48. However, the terminal block 50 of this disclosure could be used to electrically couple any electrified vehicle components that operate over an AC or a DC bus.

In this example, the ISC 48 includes a plurality of busbars 56. The busbars 56 can be housed within the capacitor housing and can be secured by potting material within the capacitor housing. The busbars 56 are considered DC link busbars or input busbars in some examples. The busbars 52, in contrast to the busbars 56, can be considered AC busbars, output busbars, or inductor busbars.

A thermal management system of the powertrain 10 is used to manage thermal energy levels in the transmission 46, the ISC 48, and terminal block. The thermal management system includes transmission fluid that can move along a circuit 60 through areas of the transmission 46, the terminal block 50, and the ISC 48. In this example, a pump 62 communicates the transmission fluid along the circuit 60.

Along the circuit 60, transmission fluid moves from a sump 64 within the transmission 46 to a radiator 66. The radiator 66 is a fluid-to-air heat exchanger. At the radiator 66, thermal energy within the transmission fluid is transferred to air. Thus, transmission fluid moving away from the radiator 66 is cooler than the transmission fluid entering the radiator.

Transmission fluid that has been cooled at the radiator 66 moves to the transmission 46. The transmission 46 includes a transmission conduit 80 that communicates the transmission fluid to the terminal block 50. The terminal block 50 includes a first terminal block conduit 82 that communicates the transmission fluid received from the terminal block 50 to the ISC 48.

The transmission fluid moving along the path P within the ISC 48 can manage thermal energy of components of the ISC 48. For example, the transmission fluid exiting the first terminal block conduit 82 moves through areas of the ISC 48 to cool the busbars In this example, the transmission fluid cools, in particular, busbars 56 of the ISC 48. In the exemplary embodiment, although the transmission fluid moves along path P through the transmission 46 and terminal block 50 before reaching the busbars 56, the busbars 56 are substantially the first component that is cooled by the transmission fluid.

Transmission fluid that has taken on thermal energy from the busbars 56 moves along the path P back to the terminal block 50. The transmission fluid then takes on more thermal energy from the busbars 52 within the terminal block 50.

The transmission fluid then moves from the terminal block 50 to the sump 64. The terminal block 50 includes a second terminal block conduit 84 that communicates the transmission fluid received from the terminal block 50 to the ISC 48.

The transmission fluid within the transmission 46 may, prior to moving to the sump 64, take on thermal energy from various components of the transmission 46 to manage thermal energy within these components. For example, transmission fluid exiting the terminal block 50 can move through areas of the motor 16, areas of the generator 14, gear sets/bearings, or some combination of these components within the transmission 46. After transferring thermal energy away from these components, the fluid moves to the sump 64. The pump 62 can then draw the fluid from the sump 64 to cool the fluid at the radiator 66.

Figure 3:
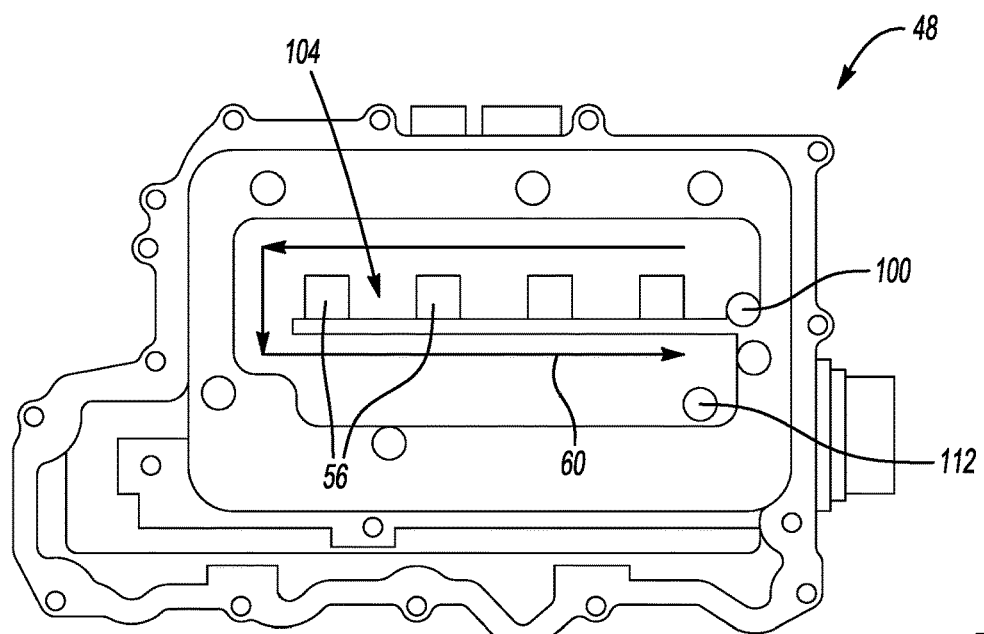
FIG. 3 illustrates a bottom view of an inverter system controller from the system of FIG. 2.

FIG. 3 shows a bottom view of the ISC 48 according to an exemplary aspect of the present disclosure. Transmission fluid enters the ISC 48 from the first terminal block conduit 82 at an ISC inlet 100. The fluid then moves through a chamber 104 to take on thermal energy from the busbars 56 along with other components of the ISC 48, such as capacitor cells. The fluid then moves through an ISC outlet 112 to the terminal block 50.

Figure 6:
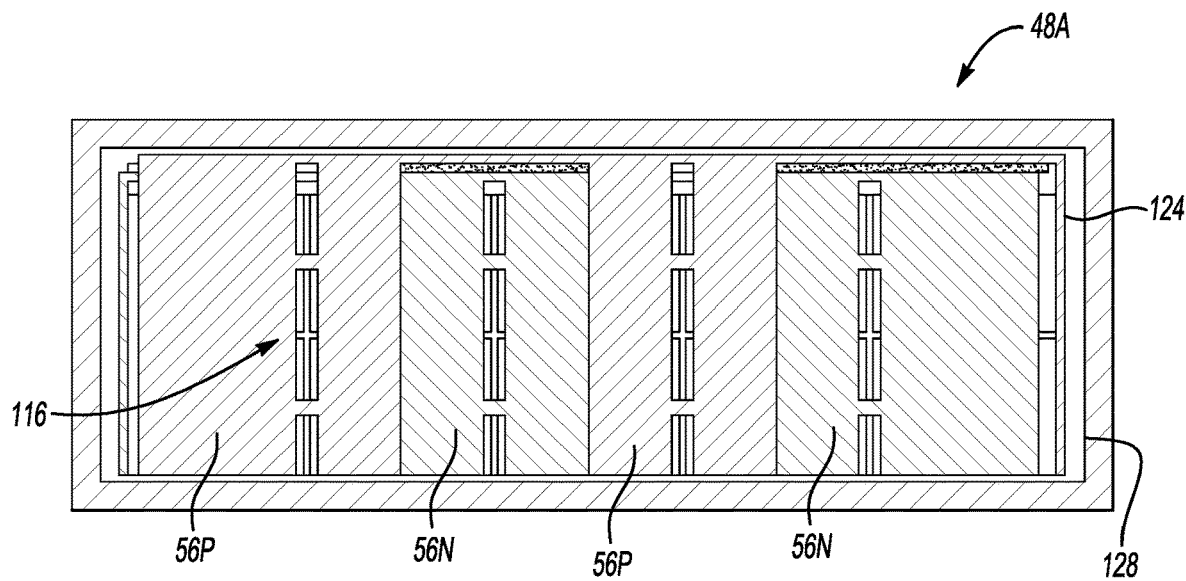
FIG. 6 shows a bottom view of the inverter system controller of FIG. 4.

FIGS. 4-6 illustrate an ISC 48A according to another exemplary embodiment of the present disclosure. The ISC 48A includes busbars 56P associated with positive capacitor terminals and busbars 56N associated with negative capacitor terminals. The busbars 56P and 56N are configured such that the busbars 56P and 56N include a portion disposed at an interface between the terminal block 50 and the ISC 48A. In the example, the busbars 56P and 56N each include substantial areas extending along a side 116 of the ISC 48A, which is the side interfacing with the HVAC terminal block 50 (FIG. 2). The side 116 is a bottom side of the ISC 48A in this example.

Portions of the busbars 56P and 56N can extend between capacitors cells 120 of the ISC 48A. The busbars 56P and 56N are configured such that both P and N terminals are exposed to transmission fluid running along the bottom side 116, which faces the transmission 46.

The busbars 56P and 56N are copper in this example. Where required, insulation 124 can be used to electrically isolate the busbars 56P and 56N from each other. Potting resin 128 can be disposed about the busbars 56P, 56N, the capacitor cells 120 and the insulation 124.

A chamber 104A can be configured such that the path P of the transmission fluid within the chamber 104A follows along the side 116 of the ISC 48A. Thermal transfer from the busbars 56P and 56N is enhanced as substantial areas of the busbars 56P and 56N extend along the bottom side 116 of the ISC 48A.

The configuration of the ISC 48A facilitates thermal energy transferred from the busbars 56P and 56N to the transmission fluid by helping to maximize surface area of the busbars 56P and 56N exposed to the transmission fluid moving within the chamber 104A. In this example, boundaries of the chamber 104 can be delineated by the busbars 56P, 56N, a housing of the capacitor cells 120, and the terminal block 50.

Figure 7:
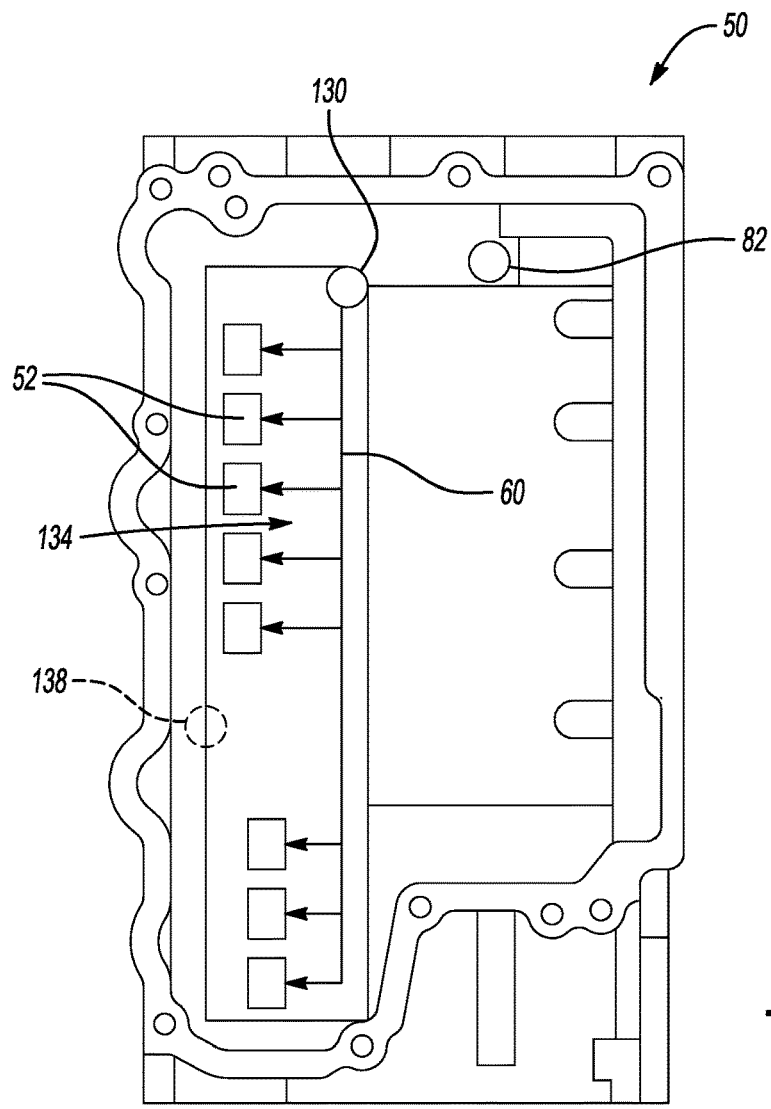
FIG. 7 illustrates a top view of a terminal block from the system of FIG. 2.

Referring to FIG. 7 with reference again to FIG. 3, transmission fluid that has moved through the outlet 112 moves into the terminal block 50 through an inlet 130 in the terminal block 50 to a chamber 134. From the chamber 134, the fluid can flow along the individual busbars 52 to take on thermal energy from the busbars 52. The transmission fluid then moves from the terminal block 50 through one or more outlets 138 to the transmission 46 (FIG. 2). The transmission fluid can then take on thermal energy from various components of transmission 46 before collecting in the sump 64.

Some features of the disclosed examples include an ISC that requires relatively less packaging space than other ISC designs. Among other things, thermal management can facilitate reducing a size of capacitor cells and current sensors, which can lead to a reduced ISC packaging envelope.

Another feature is enhanced thermal management efficiency, which can improve thermal performance for capacitors and current sensors, and improve overall ISC reliability and durability.

Another feature is that a thermal management fluid other than the transmission fluid may not be required to manage thermal energy within the ISC, which can reduce complexity. For certain current sensors of the ISC, such a giant magnetoresistance current sensor, the accuracy of the sensor can decrease at higher temperature.

Yet another feature of this disclosure is keeping the current sensor cooled, which can improve overall current sensor accuracy over operating range.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. An electrified vehicle thermal management system, comprising:
    a transmission;
    an inverter; and
    a terminal block disposed between the transmission and the inverter, the terminal block including a conduit configured to deliver transmission fluid from the transmission to the inverter.

2. The thermal management system of claim 1, wherein the conduit is a first conduit, wherein the terminal block includes a second conduit configured to deliver transmission fluid from the inverter to the transmission.

3. The thermal management system of claim 2, further comprising a plurality of terminal block busbars of the terminal block, the second conduit configured to communicate transmission fluid that is received from the inverter adjacent to the plurality of terminal block busbars to manage thermal energy within the plurality of terminal block busbars.

4. The thermal management system of claim 3, further comprising plurality of inverter busbars of the inverter, the first conduit configured to deliver transmission fluid to the inverter, the transmission fluid managing thermal energy levels within the plurality of inverter busbars.

5. The thermal management system of claim 4, wherein the plurality of terminal block busbars electrically couple the inverter to a motor within the transmission.

6. The thermal management system of claim 1, further comprising a pump configured to circulate transmission fluid from the transmission through a first conduit in the terminal block to the inverter, and from the inverter through a second conduit in the terminal block to the transmission.

7. The thermal management system of claim 6, wherein the pump draws the transmission fluid from a sump within the transmission.

8. The thermal management system of claim 7, wherein the pump communicates the transmission fluid from the sump to a radiator that is configured to transfer thermal energy from the transmission fluid to air.

9. The thermal management system of claim 8, wherein the pump communicates the transmission fluid from the radiator through a conduit in terminal block and then to the inverter.

10. The thermal management system of claim 1, further comprising plurality of busbars of the inverter, the plurality of busbars each configured such that the busbars include a portion disposed at an interface between the terminal block and the inverter.

11. The thermal management system of claim 1, wherein the inverter is an inverter system controller of an electrified vehicle.

12. The thermal management system of claim 1, further comprising a radiator that is configured to transfer thermal energy from the transmission fluid to air.

13. The thermal management system of claim 1, further comprising a plurality of busbars at least partially within the inverter and outside the transmission, the plurality of busbars cooled by transmission fluid that is circulated outside the transmission.

14. The thermal management system of claim 1, wherein the transmission is a transmission of an electrified vehicle.

15. The thermal management system of claim 1, wherein the terminal block is secured directly to the transmission, wherein the inverter is secured directly to the terminal block.

16. An electrified vehicle thermal management method, comprising:
    circulating a transmission fluid between a transmission, a terminal block, and an inverter; and
    using the transmission fluid to manage thermal energy within the inverter.

17. The thermal management method of claim 16, further comprising communicating the transmission fluid from the transmission through a conduit in a terminal block and then to the inverter.

18. The thermal management method of claim 17, further comprising using the transmission fluid to manage thermal energy within busbars of the inverter.

19. The thermal management method of claim 18, further comprising communicating the transmission fluid from the inverter through another conduit in the terminal block and then back to the transmission.

* * * * *